US007391877B1

(12) United States Patent
Brungart

(10) Patent No.: US 7,391,877 B1
(45) Date of Patent: Jun. 24, 2008

(54) SPATIAL PROCESSOR FOR ENHANCED PERFORMANCE IN MULTI-TALKER SPEECH DISPLAYS

(75) Inventor: Douglas S. Brungart, Bellbrook, OH (US)

(73) Assignee: United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 11/731,561

(22) Filed: Mar. 30, 2007

Related U.S. Application Data

(63) Continuation-in-part of application No. 10/402,450, filed on Mar. 31, 2003, now abandoned.

(51) Int. Cl.
*H04R 5/02* (2006.01)
*H04R 5/00* (2006.01)
*H04R 3/00* (2006.01)
*H03G 3/00* (2006.01)
*H04B 15/00* (2006.01)
*G10L 15/00* (2006.01)
*G10L 19/00* (2006.01)

(52) U.S. Cl. .......................... 381/310; 381/17; 381/309; 381/1; 381/104; 381/107; 381/93; 381/61; 381/111; 704/250; 704/246; 704/200.1; 379/406.01

(58) Field of Classification Search .................. 381/93, 381/104, 107, 17, 309, 310, 1; 704/500.1, 704/250, 246, 200.1; 379/406.01, 202.01
See application file for complete search history.

(56) References Cited

U.S. PATENT DOCUMENTS 4,817,149 A 3/1989 Myers
5,020,098 A * 5/1991 Celli ..................... 379/202.01
5,371,799 A 12/1994 Lowe et al.
5,438,623 A * 8/1995 Begault ........................ 381/17
5,440,639 A 8/1995 Suzuki et al.
5,521,981 A 5/1996 Gehring
5,647,016 A 7/1997 Takeyama
5,734,724 A * 3/1998 Kinoshita et al. ............. 381/17
5,809,149 A 9/1998 Cashion et al.
5,822,438 A 10/1998 Sekine et al.
6,011,851 A * 1/2000 Connor et al. ................ 381/17
6,072,877 A * 6/2000 Abel ........................... 381/17
6,078,669 A 6/2000 Maher
6,118,875 A * 9/2000 Møller et al. .................. 381/1
6,931,123 B1 * 8/2005 Hughes ................. 379/406.01

(Continued)

OTHER PUBLICATIONS

Hawley, Monica L. et al. Speech Intelligibility and localization in a multisource environment. J. Acoust. Soc. Am. 105 (6), Jun. 1999.*

(Continued)

*Primary Examiner*—Vivian Chin
*Assistant Examiner*—Devona E. Faulk
(74) *Attorney, Agent, or Firm*—AFMCLO/JAZ; Gina S. Tollefson

(57) ABSTRACT

Optimal head related transfer function spatial configurations designed to maximize speech intelligibility in multi-talker speech displays by spatially separating competing speech channels combined with a method of normalizing the relative levels of the different talkers in a multi-talker speech display that improves overall performance even in conventional multi-talker spatial configurations.

8 Claims, 4 Drawing Sheets

U.S. PATENT DOCUMENTS 6,978,159 B2 * 12/2005 Feng et al. .................. 455/570

OTHER PUBLICATIONS

Brungart, Douglas. Auditory Parallax Effects in the HRTF for nearby sources. Proceedings IEEE Workshop on Applications of Signal Processing to audio and acoustics. Oct. 17-20, 1999.*

Brungart, Douglas. Auditory Localziation of Nearby Sources in a Virtual Audo Display. Oct. 21-24, 2001.*

Brungart, Douglas. A Speech-Based Auditory Distance Display. AES 109th Convention, Los Angeles, Sep. 22-25, 2000.*

Hawley, Monica L. et al. Speech Intelligibility and localization ina multisouce environment. J. Acoust. Soc. Am. 105(6), Jun. 1999.*

Brungart, Douglas. Auditory Parallax Effects in the HRTF for Nearby Sources. Proceedings 1999 IEEE Workshop on Applications of Signal Processing to Audio and Acoustics. Oct. 17-20, 1999.*

Brungart, Douglas. Auditory Localization of Nearby Sources in a Virtual Audio Display. Oct. 21-24, 2001.*

Brungart, Douglas. Near Field Virtual Audio Displays. Presence, vol. 11, No. 1, Feb. 2002, pp. 93-106.*

Yost, William A. et al. A Simulated "Cocktail Party" with up to Three Sound Sources. Psychonomic Society 1996.*

* cited by examiner

SPATIAL PROCESSOR FOR ENHANCED PERFORMANCE IN MULTI-TALKER SPEECH DISPLAYS

CROSS-REFERENCE TO RELATED APPLICATION

This is a continuation-in-part of prior application Ser. No. 10/402,450, filed Mar. 31, 2003 now abandoned.

RIGHTS OF THE GOVERNMENT

The invention described herein may be manufactured and used by or for the Government of the United States for all governmental purposes without the payment of any royalty.

BACKGROUND OF THE INVENTION

The field of the invention is multi-talker communication systems. Many important communications tasks require listeners to extract information from a target speech signal that is masked by one or more competing talkers. In real-world environments, listeners are generally able to take advantage of the binaural difference cues that occur when competing talkers originate at different locations relative to the listener's head. This so-called "cocktail party" effect allows listeners to perform much better when they are listening to multiple voices in real-world environments where the talkers are spatially-separated than they do when they are listening with conventional electroacoustic communications systems where the speech signals are electronically mixed together into a single signal that is presented monaurally or diotically to the listener over headphones.

Prior art has recognized that the performance of multitalker communications systems can be greatly improved when signal-processing techniques are used to reproduce the binaural cues that normally occur when competing talkers are spatially separated in the real world. These spatial audio displays typically use filters that are designed to reproduce the linear transformations that occur when audio signals propagate from a distant sound source to the listener's left or right ears. These transformations are generally referred to as head-related transfer functions, or HRTFs. If a sound source is processed with digital filters that match the HRTFs of the left and right ears and then presented to the listener through stereo headphones, it will appear to originate from the location relative to the listener's head where the HRTF was measured. Prior research has shown that speech intelligibility in multichannel speech displays is substantially improved when the different competing talkers are processed with HRTF filters for different locations before they are presented to the listener.

TABLE 1

Summary of locations used to spatially separate talkers in prior art

| Study | # of Talkers | Talker Locations |
|---|---|---|
| 1) Cherry (1953) | 2 | Non-spatial (left ear only, right ear only) |
| 2) Triesman (1964) | 3 | Non-spatial (left ear only, right ear only, both ears) |
| 3) Moray et al. (1964) | 4 | Non spatial (L only, 2/3 L + 1/3 R; 1/3 L + 2/3 R; R only) |
| 4) Abouchacra et al. (1997) | 3 | −20, 0, 20 azimuth or −90, 0, 90 azimuth |
| 5) Spieth et al. (1954) | 4 | −90, −45, +45, +90 Azimuth |
| 6) Drullman & Bronkhorst (2000) | 4 | −90, −45, 0, +45, +90 |
| 7) Yost (1996) | 7 (3) | −90, −60, −30, 0, +30, +60, +90 azimuth |
| 8) Hawley et al. (1999) | 7 (2-4) | −90, −60, −30, 0, +30, +60, +90 azimuth |
| 9) Crispien & Ehrenberg (1995) | 4 | −90 az, +60 el; −30 az, +20 el; −30 az, −20 el; −90 az, −60 el |
| 10) Nelson et al. (1998) | 8 (2-8) | 6: −90, −70, −31, +31, +70, +90 7: −90, −69, −45, 0, +45, +69, +90 8: −90, −69, −45, −11, +11, +45, +69, +90 azimuth |
| 11) Simpson et al. (1998) | 8 (2-8) | 7: −90, −69, −135, 0, +135, +69, +90 8: −90, −69, −135, −11, +11, +135, +69, +90 azimuth |
| 12) Ericson & McKinley (1997) | 4 | −135, −45, +45, +135 azimuth (w/ head tracking) |
| 13) Brungart & Simpson (2001) | 2 | 90 degrees azimuth, 1 m; 90 degrees azimuth, 12 cm |

Although a number of different systems have demonstrated the advantages of spatial filtering for multi-talker speech perception, very little effort has been made to systematically develop an optimal set of HRTF filters capable of maximizing the number of talkers a listener can simultaneously monitor while minimizing the amount of interference between the different competing talkers in the system. Most systems that have used HRTF filters to spatially separate speech channels have placed the competing channels at roughly equally spaced intervals in azimuth in the listener's frontal plane. Table 1 provides examples of the spatial separations used in previous multi-talker speech displays. The first three entries in the table represent early systems that used stereo panning over headphones rather than head-related transfer functions to spatially separate the signals. This method has been shown to be very effective for the segregation of two talkers (where the talkers are presented to the left and right earphone), somewhat effective for the segregation of three talkers (where one talker is presented to the left ear, one talker is presented to the right ear, and one talker is presented to both ears), and only moderately effective in the segregation of four talkers (where two talkers are presented to the left and right ears, one talker is presented more loudly in the left ear than in the right ear, and one talker is presented more loudly in the right ear than the left ear). However, these panning methods have not been shown to be effective in multi-talker listening configurations with more than four talkers.

The other entries in the table represent more recent implementations that either used loudspeakers to spatially separate the competing speech signals or used HRTFs that accurately reproduced the interaural time and intensity difference cues that occur when real sound sources are spatially separated around the listener's head. The majority of these implementations (entries 4-8 in Table 1) have used talker locations that were equally spaced in the azimuth across the listener's frontal plane. One implementation (entry 9 in Table 1) has spatially separated the speech signals in elevation as well as azimuth, varying from +60 degrees elevation to −60 degrees elevation as the source location moves from left to right. And two implementations (entries 10 and 11 in Table 1) have used a location selection mechanism that selects talker locations in a procedure designed to maximize the difference in source midline distance (SML) between the different talkers in the stimulus.

Recently, a talker configuration has been proposed in which the target and masking talkers are located at different distances (12 cm and 1 m) at the same angle in azimuth (90 degrees) (entry 13 in Table 1). This spatial configuration has been shown to work well in situations with only two competing talkers, but not with more than two competing talkers.

No previous studies have objectively measured speech intelligibility as a function of the placement of the competing talkers. However, recent results have shown that equal spacing in azimuth cannot produce optimal performance in systems with more than five possible talker locations. Tests have also shown that the performance of a multi-talker speech display can be improved by carefully balancing the relative levels of the different speech signals in the stimulus. The present invention consists of optimal HRTF spatial configurations that have been carefully designed to maximize speech intelligibility in multi-talker speech displays, and a method of normalizing the relative levels of the different talkers in a multi-talker speech display that improves overall performance even in conventional multi-talker spatial configurations.

SUMMARY OF THE INVENTION

Optimal head related transfer function spatial configurations designed to maximize speech intelligibility in multi-talker speech displays by spatially separating competing speech channels combined with a method of normalizing the relative levels of the different talkers in a multi-talker speech display that improves overall performance even in conventional multi-talker spatial configurations.

It is therefore an object of the invention to provide a speech-intelligibility-maximizing multi-talker speech display.

It is another object of the invention to provide an interference-minimizing multi-talker speech display.

It is another object of the invention to provide a method of normalizing that sets the relative levels of the talkers in each location such that each talker will produce roughly the same overall level at earphone where the signal generated by that talker is most intense.

These and other objects of the invention are achieved by the description, claims and accompanying drawings are achieved by an interference-minimizing and speech-intelligibility-maximizing head related transfer function (HRTF) spatial configuration method comprising the steps of:

receiving a plurality of speech input signals from competing talkers;

filtering said speech input signals with head-related transfer functions;

normalizing overall levels of said head related transfer functions from each source location whereby each talker will produce the same overall level in the selected ear where the talker is most intense;

combining the outputs of said head related transfer functions; and communicating outputs of said head related transfer functions to headphones of a system operator.

DETAILED DESCRIPTION OF THE INVENTION

The HRTFs used in this invention differ from previous HRTFs used in multi-talker speech displays in two important ways: 1) in the spatial configuration chosen for the seven competing talker locations, and 2) in the level normalization applied to the HRTFs at these different locations. First, spatial configuration is addressed.

Figure 1A:
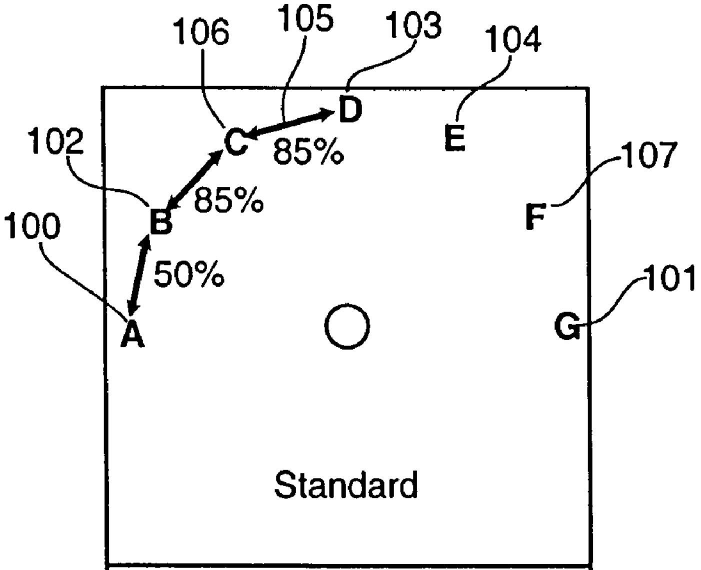
FIG. 1*a* shows a standard spatial configuration for a system with seven competing talkers.
Figure 1B:
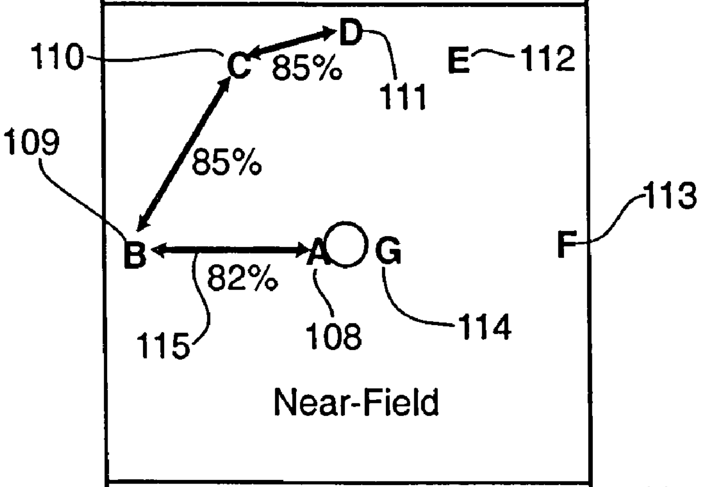
FIG. 1*b* shows a near-field configuration for a system with seven competing talkers.
Figure 1C:
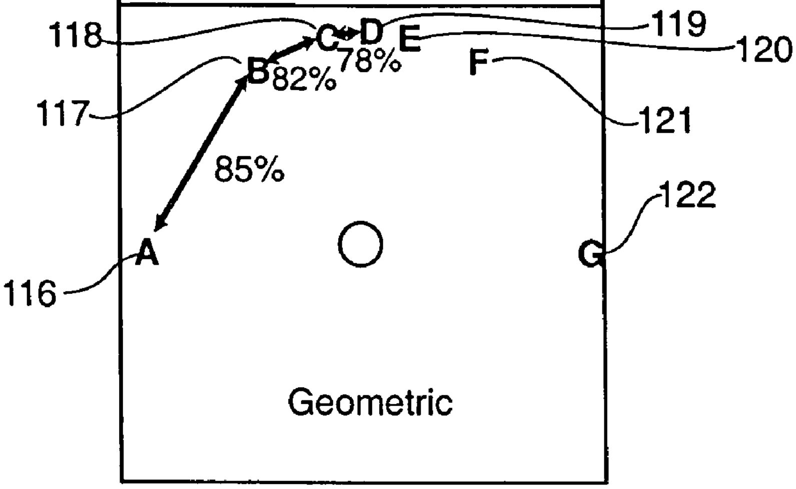
FIG. 1*c* shows a geometric configuration for a system with seven competing talkers.

FIGS. 1*a*-1*c* show three spatial configurations for a system with seven competing talkers identified as A-G. The percentages on the arrows indicate performances in a two-talker listening task with talkers located at the two endpoints of the arrows. FIG. 1*a* illustrates a standard multi-talker speech display configuration with seven talker locations evenly spaced in azimuth in the horizontal plane. Talker A is shown at 100 and talker G is shown at 101. Talkers A through G are located at −90, −60, −30, 0, 30, 60, and 90 degrees in azimuth. The numbers on the double-headed arrows in the figure, one of which is shown at 105, indicate the level of speech intelligibility that occurs when only two talkers are active in the system and those two talkers happen to occur at adjacent source locations. These values were measured with a Coordinate Response Measure, a task that requires listeners to attend to two or more simultaneous phrases of the form Ready (call sign) go to (color) (number) now (with eight possible call signs, four colors, and eight numbers), and identify the color and number coordinates addressed to their pre-assigned call-sign. In each case, the rms levels of the signals were normalized after the spatial processing to have a signal to noise ratio of 0 dB in the better ear (the left ear for locations A, B, C and D illustrated in FIG. 1*a*). Although performance was reasonably good (>80%) when the two competing talkers were located at the 0 degree location shown at 103 and 30 degree locations shown at either 104 or 106 (C and D or D and E), or when they were located at the 30 degree locations at 104 or 106 and 60 degree locations 102 or 107 (B and C or E and F), performance was quite bad (50% correct responses) when the two competing talkers happened to occur at the 60 degree locations at 102 or 107 and 90 degree locations at 100 or 101 (A and B or F and G). Indeed, performance when the talkers were located at 60 and 90 degrees was no better than when both talkers were located at 90 degrees in this particular task. This reflects the fact that listeners are relatively insensitive to changes in the source locations of talkers near 90 degrees in azimuth. Thus, it is clear that even separation in azimuth does not generally imply equal perceptual separation between the talkers in a multi-talker speech display. Note that this result is consistent with previous research which has shown that listeners are 6-10 or more times as sensitive to changes in the azimuth locations of sound sources near 0 degrees azimuth than they are to changes in the azimuth locations of sound sources near ±90 degrees in azimuth. Also note that, although we didn't explicitly test source locations determined with the maximal source-midline distance (SML), a maximal SML configuration would lead to performance even worse than the configuration in FIG. 1*a* because it tends to place sound sources even closer to the 90 degree source location than configurations that are evenly spaced in azimuth.

FIG. 1*b* shows a proposed alternative spatial configuration of the invention. In this configuration, five of the talkers shown at 109-113 (or B, C, E and F) are located at azimuth angles of −90, −30, 0, 30, and 90 degrees and at a distance of 1 m (measured from the center of the listener's head). The other two talkers shown at 108 and 114 (A and G) are located at ±90 degrees in azimuth and a distance of 12 cm (measured from the center of the head). The double-headed arrows, one of which is illustrated at 115, show that performance in the CRM task was at least 82% for all of the pairs of possible adjacent talker locations in this "near-field" configuration. There is no indication of the drop-off in performance that occurred in the standard configuration when the active talkers were located at locations 108 and 109 or 113 and 114 (A and B, or F and G). Thus, by moving the ±60 degree talkers to ±90 degrees and decreasing their distance to 12 cm, the proposed "near-field" configuration improves performance by more than 60% for the worst-case pair of competing talker locations in the system.

FIG. 1*c* shows another proposed alternative spatial configuration of the invention. In this "geometric" configuration, the talkers, shown at 116-122 were located at −90, −30, −10, 0, 10, 30, and 90 degrees in azimuth. In this configuration, minimal performance (78%) occurs when the two competing talkers occur at locations near the median plane at 118-121 (C and D or D and E). Performance in this configuration is not as good as in the "near-field" configuration of FIG. 1*b*, but performance for the worst-case pair of competing talkers is still improved by 56% over the worst-case pair with the standard talker configuration of FIG. 1*a*.

Figures 2A, 2B, 2C, 2D, 2E, 2F:
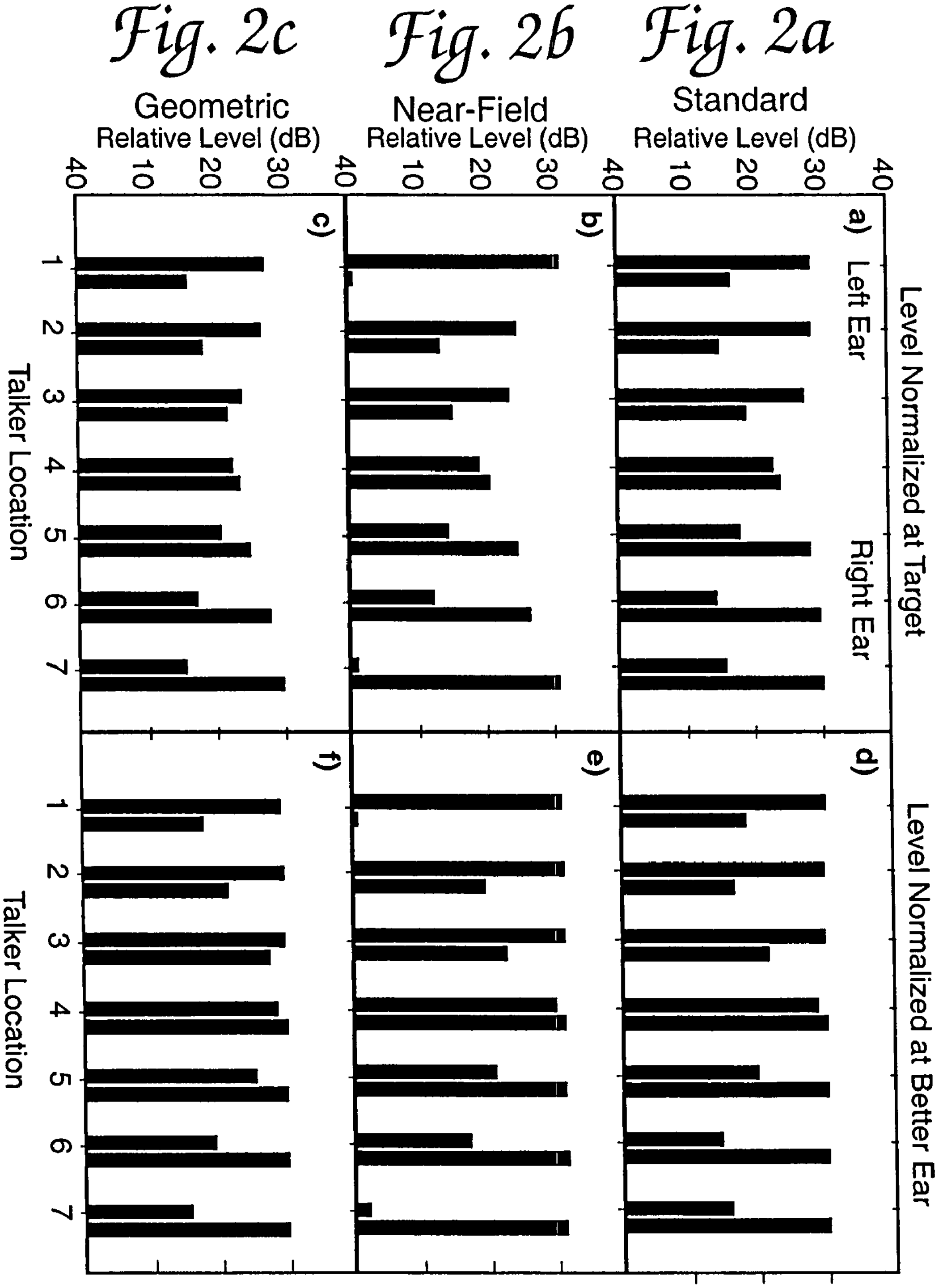
FIG. 2*a* shows RMS levels for standard configuration HRTF filters at left and right ears for standard normalization at target.
FIG. 2*b* shows RMS levels for near-field configuration HRTF filters at left and right ears for standard normalization at target.
FIG. 2*c* shows RMS levels for geometric configuration HRTF filters at left and right ears for standard normalization at target.
FIG. 2*d* shows RMS levels for standard configuration HRTF filters at left and right ears for better ear normalization scheme of the invention.
FIG. 2*e* shows RMS levels for standard configuration HRTF filters at left and right ears for better ear normalization scheme of the invention.
FIG. 2*f* shows RMS levels for standard configuration HRTF filters at left and right ears for better ear normalization scheme of the invention.

Another novel feature of the present invention is the normalization procedure used to set the relative levels of the talkers. Previous multi-talker speech displays with more than two simultaneous talkers generally used HRTFs that were equalized to simulate the levels that would occur from spatially-separated talkers speaking at the same level in the free field, or (for talkers at different distances) to ensure that each talker would produce the same level of acoustic output at the location of the center of the listener's head if the head were removed from the acoustic field. FIGS. 2*a*-2*c* illustrate the relative signal levels at the left and right ears that occur for the three spatial configurations shown in FIGS. 1*a*-1*c* with traditional source equalization schemes. In each case, the relative level of the left ear systematically decreases and the relative level of the right ear systematically increases as the sound moves from left to right. A problem with this spatial configuration is that the source locations near the midline are attenuated relative to talkers in the right hemisphere in the right ear and relative to talkers in the left hemisphere in the left ear. Thus, it is likely that listeners will have extreme difficulty hearing the talkers at location 4 in FIGS. 1*a*-1*c* when the competing talkers are also active in the left and right hemispheres.

This problem can be addressed by re-normalizing the HRTFs from each source location to set the levels of the filters so that a speech-shaped noise input will produce the same level of output at the more intense ear (left or right) at all of the speaker locations. FIGS. 2*d*-2*f* illustrate the effects of this normalization on the overall signal levels in the left and right ears in the three spatial configurations shown in FIG. 1. Note that this normalization procedure amplifies the relative levels of sound sources near the median plane. Note that many multi-talker speech systems will not necessarily receive input speech signals that are normalized in level across the different channels of the system. This could be addressed by applying some form of automatic gain control (AGC) on each speech input of the system. Also note that most listeners will want some kind of control over the relative levels of the different talkers in the system, so they can turn up the level of the most important talker. Thus, the normalized levels shown in FIG. 2 should be viewed as the default levels of the system.

Another novel feature of the present invention is the normalization procedure used to set the relative levels of the talkers. Previous multi-talker speech displays with more than two simultaneous talkers generally used HRTFs that were equalized to simulate the levels that would occur from spatially-separated talkers speaking at the same level in the free field, or (for talkers at different distances) to ensure that each talker would produce the same level of acoustic output at the location of the center of the listener's head if the head were removed from the acoustic field. FIGS. 2*a*-2*c* illustrate the relative signal levels at the left and right ears that occur for the three spatial configurations shown in FIGS. 1*a*-1*c* with traditional source equalization schemes. In each case, the relative level of the left ear systematically decreases and the relative level of the right ear systematically increases as the sound moves from left to right. FIG. 2*a* is labeled to show that within each pair of bars, the bar on the left represents the gain level of the HRTF in the left ear for that location, and the bar on the right indicates the gain level of the HRTF in the right ear for that location and this applies to each pair of bars for remaining FIGS. 2*b*-2*f*. A problem with this spatial configuration is that the source locations near the midline are attenuated relative to talkers in the right hemisphere in the right ear and relative to talkers in the left hemisphere in the left ear. Thus, it is likely that listeners will have extreme difficulty hearing the talkers at location 4 in FIGS. 1*a*-1*c* when the competing talkers are also active in the left and right hemispheres.

Each bar in FIGS. 2*a*-2*f* represents the percentage of correct identifications of the color and number in the stimulus that occurred in trials where the target talker originated from that location. In the condition where no spatialization was provided, the listeners correctly identified the color and number in just fewer than 10% of the total trials. Performance in the worst spatial configuration tested (the standard baseline configuration shown in FIG. 1*a*) was approximately 3.5 times better than in the non-spatialized condition. This overall advantage of spatial separation on multi-talker speech perception is well established in the literature, and it is commonly referred to as the "cocktail party" effect. Panels B and C show the effects that the improved "near-field" and "geometric" spatial configurations shown in FIG. 1 have on performance in the seven-talker listening task. Both of the proposed configurations produced a slight but statistically significant improvement in overall average performance (4.8% for the near-field configuration, 7.9% for the geometric configuration). Note, however, that the performance benefits were not distributed very evenly across the different talker locations—in both cases, performance substantially increased for the most lateral talker locations, but decreased at more medial talker locations. This produced a decrease in the median performance level across the seven locations in the two improved configurations.

In summary, the procedures used for normalization are as follows:

1. A set of Head Related Transfer Function Finite Response Filters is selected for the spatialization of the signal.
2. Left and right ear Finite Impulse Response Head-Related Transfer Functions at each location are then used to filter a noise signal that is shaped to match the overall long term frequency spectrum of a continuous speech signal.
3. The "root-mean-square" (RMS) levels of the signals in the left and right ears are calculated for each talker location, and the coefficients of the HRTFs for both ears are multiplied by the same scalar gain factor (i.e. Normalized) necessary to bring the RMS level in the more intense ear to the same output power level in each location.
4. The resulting normalized HRTFs (i.e. HRTFs with normalized coefficients) are implemented as shown by FIG. 3.

Figure 3:
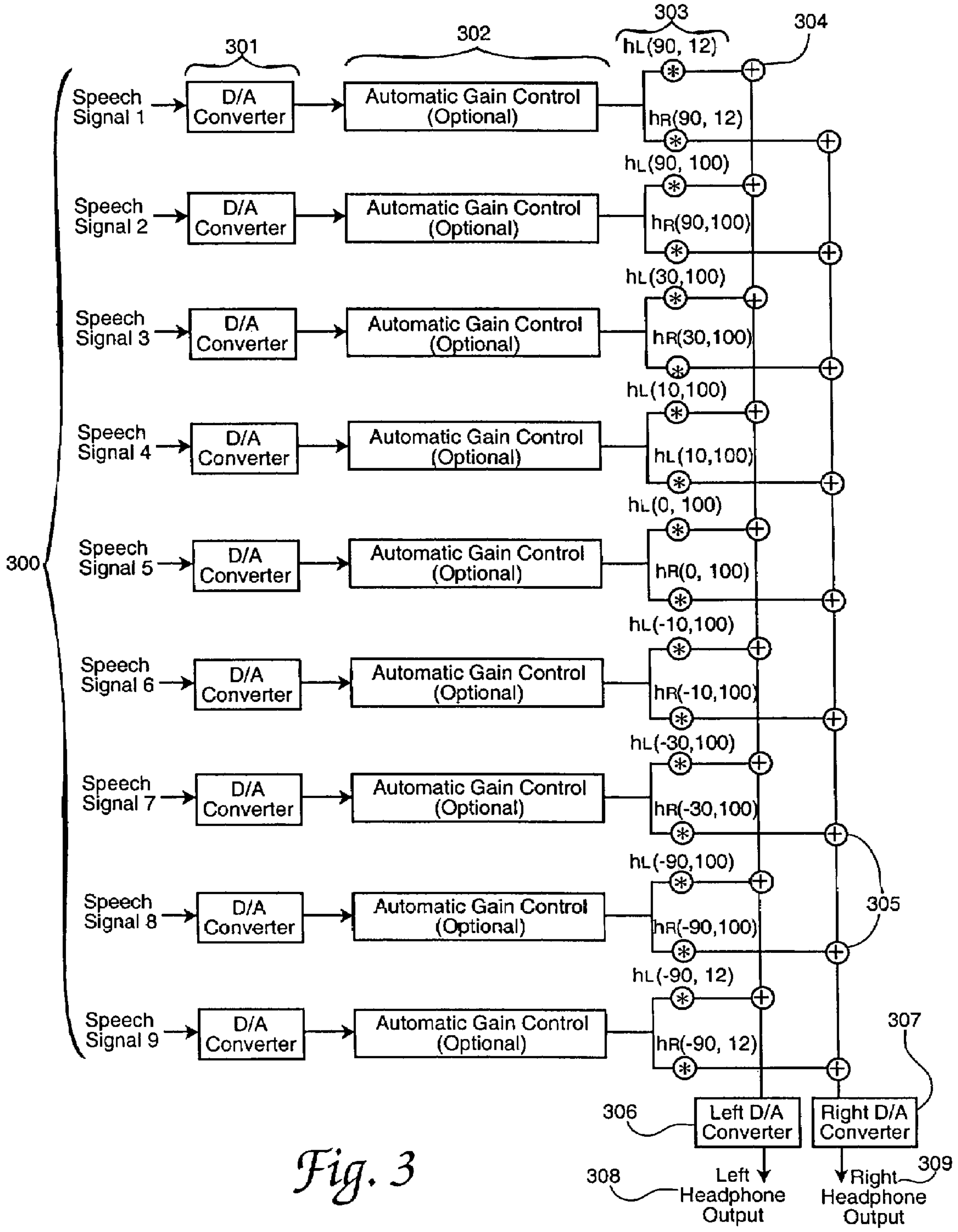
FIG. 3 shows a schematic diagram of the arrangement of the invention.

FIG. 3 shows a typical implementation of the system in a configuration where the input speech signals are analog and the HRTF filters are implemented digitally. First, the nine possible analog speech inputs, represented at 300 are converted into digital signals with an A/D converter, shown at 301. Then, if desired, the levels of the speech channels are equalized with an automatic gain control algorithm, shown at 302. Next, each signal is digitally filtered (convolved) with two different FIR filters, shown at 303, representing the left and right HRTFs of one of the nine possible talker locations shown in FIGS. 1*b* and 1*c*. In FIG. 3, these HRTFs are denoted as $H_S(a, d)$ where S is the ear used to make the HRTF measurement, a is the azimuth location of the source used to make the HRTF measurement (in degrees), and d is the distance of the source used to make the HRTF measurement (in cm) relative to the center of the listener's head. The outputs of all the left-channel HRTFs are then digitally summed, represented at 304, converted to an analog signal, represented at 306, and presented to the left earphone of a stereo headset at 308. Similarly, the outputs of all the right-channel HRTFs are digitally summed, represented at 305, converted to an analog signal, represented at 307, and presented to the right earphone of a stereo headset at 309. Note that the allocations of talkers 1-9 to the nine locations shown at 300 in FIG. 3 is arbitrary—the listener should be given the option to allocate each possible incoming channel to any one of the nine locations.

It should be noted that the arrangement as described is capable of accommodating up to 9 simultaneous speech channels. This is achieved by combining the seven talker locations in the geometric configuration with the two near-field locations in the near-field configuration (as implied in FIG. 3). In a system with more than five but fewer than nine talkers, listeners could be given the option of allocating each incoming talker to any one of the nine possible source locations. It has been shown that no significant interference occurs between any two of the nine possible filter locations shown in FIG. 3.

The proposed implementation shown in FIG. 3 represents just one possible arrangement of the invention. The system could also be implemented with IIR digital filters, or with carefully designed analog circuitry. Also, the HRTF filter coefficients provided here represent just one possible set of HRTF filters (in this case measured on a KEMAR manikin) that could be used to implement the system. The invention is based on HRTF filters that were previously measured on a KEMAR manikin using conventional HRTF measurement procedures. The set of HRTF measurements used in the described arrangements of the invention differ from all previous HRTF measurements in two ways: 1) it uses a compact acoustic point source capable of generating a compact, broadband sound source, and 2) it measures the HRTF in the horizontal plane at different distances, including distances as close as 12 cm from the center of the listener's head. Other HRTFs measured on manikins or on human listeners could also be used if the HRTFs were measured at the proper spatial locations and if the HRTFs were normalized at the location of the better ear.

The following better-ear normalized HRTF coefficients (or any constant multiple thereof) could be used to implement such a system at a 20 kHz sampling rate:

| | $H_L$ (90, 12) | $H_R$ (90, 12) | $H_L$ (90, 100) | $H_R$ (90, 100) | $H_L$ (30, 100) | $H_R$ (30, 100) | $H_L$ (10, 100) | $H_R$ (10, 100) | $H_L$ (0, 100) |
|---|---|---|---|---|---|---|---|---|---|
| Coeff 1 | −917 | 2 | −2439 | −12 | −1208 | −93 | −1341 | −107 | −1128 |
| Coeff 2 | 532 | −2 | 1772 | 13 | 696 | 106 | 956 | 144 | 855 |
| Coeff 3 | −1239 | 2 | −2115 | −14 | −1602 | −121 | −1294 | −219 | −1005 |
| Coeff 4 | 1535 | −2 | 1307 | 15 | 1052 | 140 | 451 | 397 | 390 |
| Coeff 5 | −1540 | 2 | −3283 | −17 | −1568 | −167 | −1221 | −159 | −917 |
| Coeff 6 | 111 | −2 | 162 | 19 | −4038 | 211 | −5082 | −478 | −4941 |
| Coeff 7 | −1928 | 3 | 3084 | −21 | −3937 | −393 | −867 | −1331 | −589 |
| Coeff 8 | 2197 | −3 | −7472 | 24 | 3601 | 581 | 5123 | −2373 | 6539 |
| Coeff 9 | 43453 | 3 | 56140 | −27 | 51096 | −407 | 44357 | −1369 | 40226 |
| Coeff 10 | 2192 | −4 | −7485 | 32 | 3592 | 75 | 5114 | 9626 | 6531 |
| Coeff 11 | −1916 | 4 | 3109 | −38 | −3918 | −1261 | −849 | 24535 | −573 |

-continued

| | | | | | | | | | |
|---|---|---|---|---|---|---|---|---|---|
| Coeff 12 | 92 | −4 | 121 | 46 | −4070 | −555 | −5111 | 7971 | −4967 |
| Coeff 13 | −1511 | 5 | −3222 | −58 | −1522 | 1173 | −1178 | −1474 | −879 |
| Coeff 14 | 1493 | −6 | 1216 | 81 | 983 | 9205 | 387 | −2480 | 333 |
| Coeff 15 | −1174 | 7 | −1973 | −165 | −1494 | 12825 | −1194 | −1093 | −917 |
| Coeff 16 | 412 | −9 | 1514 | 100 | 499 | 2742 | 772 | −582 | 694 |
| Coeff 17 | −436 | 11 | −1446 | −136 | −389 | 261 | −599 | 20 | −471 |
| Coeff 18 | 958 | −24 | 2251 | −229 | 1401 | −1671 | 1395 | 245 | 1201 |
| Coeff 19 | −502 | 17 | −1182 | −509 | −699 | 52 | −702 | 69 | 0 |
| Coeff 20 | 371 | −10 | 870 | 122 | 509 | −573 | 0 | 0 | 0 |
| Coeff 21 | −296 | 66 | −691 | 2506 | −402 | 536 | 0 | 0 | 0 |
| Coeff 22 | 246 | 148 | 571 | 5346 | 332 | −212 | 0 | 0 | 0 |
| Coeff 23 | −209 | 337 | −484 | 9069 | −281 | 298 | 0 | 0 | 0 |
| Coeff 24 | 181 | 502 | 418 | 4746 | 0 | 0 | 0 | 0 | 0 |
| Coeff 25 | −158 | 790 | −365 | 2331 | 0 | 0 | 0 | 0 | 0 |
| Coeff 26 | 140 | 1100 | 323 | −179 | 0 | 0 | 0 | 0 | 0 |
| Coeff 27 | −125 | 612 | −289 | −382 | 0 | 0 | 0 | 0 | 0 |
| Coeff 28 | 113 | 481 | 259 | −305 | 0 | 0 | 0 | 0 | 0 |
| Coeff 29 | −102 | 233 | −235 | −23 | 0 | 0 | 0 | 0 | 0 |
| Coeff 30 | 93 | 137 | 213 | 5 | 0 | 0 | 0 | 0 | 0 |
| Coeff 31 | −85 | 11 | −194 | −35 | 0 | 0 | 0 | 0 | 0 |
| Coeff 32 | 78 | 14 | 0 | 0 | 0 | 0 | 0 | 0 | 0 |
| Coeff 33 | −71 | −10 | 0 | 0 | 0 | 0 | 0 | 0 | 0 |
| Coeff 34 | 65 | 4 | 0 | 0 | 0 | 0 | 0 | 0 | 0 |

| | $H_R$ (0, 100) | $H_L$ (−10, 100) | $H_R$ (−10, 100) | $H_L$ (−30, 100) | $H_R$ (−30, 100) | $H_L$ (−90, 100) | $H_R$ (−90, 100) | $H_L$ (−90, 12) | $H_R$ (−90, 12) |
|---|---|---|---|---|---|---|---|---|---|
| Coeff 1 | −235 | −405 | −267 | −166 | −337 | −22 | −1755 | 3 | 347 |
| Coeff 2 | 377 | 544 | 392 | 188 | 247 | 24 | 812 | −3 | −1745 |
| Coeff 3 | −162 | −1022 | −358 | −216 | −723 | −26 | −629 | 3 | 963 |
| Coeff 4 | −713 | 991 | −753 | 253 | −88 | 28 | −804 | −3 | −3009 |
| Coeff 5 | −1892 | −1079 | −2644 | −304 | −3076 | −31 | −2545 | 4 | 3924 |
| Coeff 6 | −3353 | 784 | −2984 | 389 | −2204 | 35 | 2861 | −4 | 41644 |
| Coeff 7 | −2476 | −1157 | −3345 | −753 | −5833 | −38 | −371 | 5 | 3918 |
| Coeff 8 | 10075 | −3119 | 10220 | 832 | 7717 | 43 | −3486 | −5 | −2998 |
| Coeff 9 | 33277 | −521 | 37848 | −801 | 45974 | −48 | 50738 | 6 | 945 |
| Coeff 10 | 11232 | 8497 | 10216 | 969 | 7711 | 55 | −3498 | −6 | −1717 |
| Coeff 11 | −2460 | 30448 | −3336 | −1527 | −5821 | −63 | −346 | 7 | 306 |
| Coeff 12 | −3274 | 4197 | −2998 | −725 | −2224 | 74 | 2820 | −8 | −346 |
| Coeff 13 | −2041 | 190 | −2622 | 741 | −3046 | −89 | −2484 | 9 | 118 |
| Coeff 14 | −682 | −4220 | −785 | 8561 | −132 | 114 | −894 | −10 | −253 |
| Coeff 15 | −221 | 352 | −308 | 16378 | −655 | −236 | −488 | 11 | 831 |
| Coeff 16 | 368 | −297 | 300 | 2042 | 122 | 181 | 556 | −14 | −413 |
| Coeff 17 | 53 | −195 | 146 | 1224 | 222 | −353 | −709 | 17 | 301 |
| Coeff 18 | 478 | 276 | 526 | −2703 | 700 | 19 | 1853 | −36 | −238 |
| Coeff 19 | 0 | −125 | −246 | 856 | −330 | −598 | −912 | 37 | 196 |
| Coeff 20 | 0 | 0 | 0 | −608 | 239 | 478 | 659 | −37 | −167 |
| Coeff 21 | 0 | 0 | 0 | 501 | −189 | 2435 | −519 | 83 | 144 |
| Coeff 22 | 0 | 0 | 0 | −255 | 156 | 7501 | 426 | 52 | −126 |
| Coeff 23 | 0 | 0 | 0 | 263 | −132 | 11211 | −360 | 295 | 111 |
| Coeff 24 | 0 | 0 | 0 | 0 | 0 | 4338 | 310 | 408 | −99 |
| Coeff 25 | 0 | 0 | 0 | 0 | 0 | 1803 | −271 | 705 | 89 |
| Coeff 26 | 0 | 0 | 0 | 0 | 0 | −540 | 239 | 944 | −81 |
| Coeff 27 | 0 | 0 | 0 | 0 | 0 | −65 | −213 | 418 | 73 |
| Coeff 28 | 0 | 0 | 0 | 0 | 0 | −345 | 192 | 414 | −67 |
| Coeff 29 | 0 | 0 | 0 | 0 | 0 | 35 | −173 | 80 | 61 |
| Coeff 30 | 0 | 0 | 0 | 0 | 0 | −93 | 157 | 107 | −56 |
| Coeff 31 | 0 | 0 | 0 | 0 | 0 | 43 | −143 | −22 | 52 |
| Coeff 32 | 0 | 0 | 0 | 0 | 0 | 0 | 0 | 26 | 347 |
| Coeff 33 | 0 | 0 | 0 | 0 | 0 | 0 | 0 | −19 | −1745 |
| Coeff 34 | 0 | 0 | 0 | 0 | 0 | 0 | 0 | 12 | 963 |

The following target-normalized HRTFs (or any constant multiple thereof) could be used to implement such a system at an 8 kHz sampling rate.

| | $H_L$ (90, 12) | $H_R$ (90, 12) | $H_L$ (90, 100) | $H_R$ (90, 100) | $H_L$ (30, 100) | $H_R$ (30, 100) | $H_L$ (10, 100) | $H_R$ (10, 100) | $H_L$ (0, 100) |
|---|---|---|---|---|---|---|---|---|---|
| Coeff 1 | −1307 | 4 | −533 | −35 | −601 | 20 | −480 | 234 | −431 |
| Coeff 2 | 796 | −4 | 330 | 39 | 344 | −10 | 305 | −454 | 269 |
| Coeff 3 | −877 | 5 | −550 | −43 | −483 | −29 | −440 | 391 | −397 |
| Coeff 4 | 1120 | −6 | 190 | 48 | −365 | −142 | −243 | −487 | −53 |

-continued

| | | | | | | | | | |
|---|---|---|---|---|---|---|---|---|---|
| Coeff 5 | −702 | 7 | −1563 | −54 | −765 | 47 | −471 | 279 | −506 |
| Coeff 6 | 1137 | −8 | 386 | 61 | 1900 | −160 | 1611 | −734 | 1345 |
| Coeff 7 | −2561 | 10 | −2061 | −143 | −2914 | 141 | −2247 | 2058 | −1575 |
| Coeff 8 | −254 | −26 | −648 | 103 | −2385 | 186 | −1697 | −3333 | −1374 |
| Coeff 9 | 45614 | 10 | 22073 | −181 | 22263 | 687 | 18286 | 2861 | 16068 |
| Coeff 10 | −261 | −33 | −651 | 130 | −2389 | −2205 | −1700 | 12558 | −1376 |
| Coeff 11 | −2547 | 41 | −2056 | −323 | −2907 | 8840 | −2242 | −3653 | −1570 |
| Coeff 12 | 1116 | 24 | 378 | 186 | 1889 | 3386 | 1603 | 412 | 1337 |
| Coeff 13 | −669 | 15 | −1551 | −1336 | −748 | −2161 | −458 | 496 | −495 |
| Coeff 14 | 1072 | 376 | 173 | 5559 | −389 | 1457 | −262 | −127 | −70 |
| Coeff 15 | −802 | 1660 | −522 | 6865 | −445 | −419 | −411 | −288 | −372 |
| Coeff 16 | 660 | 2199 | 280 | −1021 | 276 | 372 | 251 | 115 | 223 |
| Coeff 17 | −786 | 850 | −346 | −1 | −331 | −364 | −270 | −129 | −252 |
| Coeff 18 | 1188 | 109 | 472 | −249 | 571 | 206 | 454 | 71 | 400 |
| Coeff 19 | −623 | −14 | −256 | 75 | −295 | −276 | 0 | 0 | 0 |
| Coeff 20 | 459 | 67 | 191 | −146 | 217 | 282 | 0 | 0 | 0 |
| Coeff 21 | −365 | −24 | −153 | 73 | 0 | 0 | 0 | 0 | 0 |
| Coeff 22 | 302 | 3 | 127 | −113 | 0 | 0 | 0 | 0 | 0 |
| Coeff 23 | −256 | −18 | −108 | 90 | 0 | 0 | 0 | 0 | 0 |
| Coeff 24 | 221 | 5 | 0 | 0 | 0 | 0 | 0 | 0 | 0 |

| | $H_R$ (0, 100) | $H_L$ (−10, 12) | $H_R$ (−10, 12) | $H_L$ (−30, 100) | $H_R$ (−30, 100) | $H_L$ (−90, 100) | $H_R$ (−90, 100) | $H_L$ (−90, 12) | $H_R$ (−90, 12) |
|---|---|---|---|---|---|---|---|---|---|
| Coeff 1 | −360 | 269 | −398 | 35 | −524 | −42 | −387 | 4 | −1462 |
| Coeff 2 | 245 | −529 | 290 | −27 | 336 | 47 | 250 | −5 | 890 |
| Coeff 3 | −304 | 435 | −373 | −12 | −431 | −52 | −410 | 5 | −871 |
| Coeff 4 | −122 | −634 | −260 | −180 | −420 | 57 | −137 | −6 | 992 |
| Coeff 5 | −502 | 485 | −505 | 12 | −714 | −63 | −1070 | 7 | −619 |
| Coeff 6 | 1687 | −933 | 2038 | −245 | 2405 | 67 | 616 | −8 | 1686 |
| Coeff 7 | −1947 | 1937 | −2715 | 330 | −3516 | −179 | −2333 | 10 | −3640 |
| Coeff 8 | −1649 | −3020 | −1815 | −178 | −2552 | 118 | 246 | −23 | −664 |
| Coeff 9 | 15862 | 3247 | 17926 | 1073 | 22128 | −225 | 19185 | 6 | 51342 |
| Coeff 10 | −1355 | 12529 | −1817 | −2354 | −2554 | 195 | 244 | −35 | −671 |
| Coeff 11 | −2120 | −3594 | −2711 | 9017 | −3510 | −539 | −2330 | 47 | −3625 |
| Coeff 12 | 1749 | 877 | 2031 | 4005 | 2395 | 264 | 610 | −13 | 1661 |
| Coeff 13 | −518 | 4 | −495 | −2140 | −700 | −1371 | −1061 | 46 | −583 |
| Coeff 14 | −108 | 56 | −276 | 1520 | −441 | 6549 | −150 | 238 | 939 |
| Coeff 15 | −313 | −333 | −348 | −616 | −398 | 6780 | −390 | 1540 | −788 |
| Coeff 16 | 229 | 104 | 245 | 572 | 276 | −1329 | 213 | 2028 | 738 |
| Coeff 17 | −224 | −180 | −224 | −524 | −290 | 241 | −248 | 554 | −881 |
| Coeff 18 | 354 | 97 | 380 | 223 | 500 | −528 | 345 | 76 | 1324 |
| Coeff 19 | 0 | 0 | 0 | −324 | −261 | 182 | −186 | −18 | −693 |
| Coeff 20 | 0 | 0 | 0 | 322 | 193 | −216 | 139 | 46 | 510 |
| Coeff 21 | 0 | 0 | 0 | 0 | 0 | 111 | −111 | −17 | −405 |
| Coeff 22 | 0 | 0 | 0 | 0 | 0 | −170 | 92 | −5 | 335 |
| Coeff 23 | 0 | 0 | 0 | 0 | 0 | 140 | −78 | −17 | −284 |
| Coeff 24 | 0 | 0 | 0 | 0 | 0 | 0 | 0 | 7 | 245 |

The following better-ear normalized HRTFs (or any constant multiple thereof) could be used to implement such a system at an 8 kHz sampling rate.

| | $H_L$ (90, 12) | $H_R$ (90, 12) | $H_L$ (90, 100) | $H_R$ (90, 100) | $H_L$ (30, 100) | $H_R$ (30, 100) | $H_L$ (10, 100) | $H_R$ (10, 100) | $H_L$ (0, 100) |
|---|---|---|---|---|---|---|---|---|---|
| Coeff 1 | −29 | 0 | −32 | −5 | −40 | 4 | −37 | 63 | −36 |
| Coeff 2 | 43 | −2 | 59 | 25 | 61 | −37 | 66 | −238 | 66 |
| Coeff 3 | 91 | 4 | 42 | −67 | 111 | 128 | 64 | 462 | 52 |
| Coeff 4 | −483 | −7 | −377 | 124 | −621 | −282 | −480 | −637 | −440 |
| Coeff 5 | 1180 | 10 | 1003 | −180 | 1532 | 472 | 1236 | 677 | 1145 |
| Coeff 6 | −2556 | −11 | −2848 | 216 | −3317 | −689 | −2830 | −598 | −2582 |
| Coeff 7 | 3319 | 12 | 2401 | −258 | 4172 | 884 | 3510 | 406 | 3450 |
| Coeff 8 | −7660 | −13 | −8014 | 298 | −12674 | −1222 | −11414 | −300 | −10606 |
| Coeff 9 | 25309 | 13 | 25879 | −342 | 28861 | 1795 | 28139 | −4585 | 27500 |
| Coeff 10 | 17585 | −14 | 18185 | 394 | 18916 | −3635 | 18852 | 25575 | 18538 |
| Coeff 11 | −7862 | 13 | −8629 | −469 | −12410 | 7657 | −11502 | 6225 | −10693 |
| Coeff 12 | 4349 | −12 | 3825 | 531 | 5806 | 14039 | 5211 | −5743 | 4963 |
| Coeff 13 | −2790 | 2 | −2176 | −1289 | −3548 | −3098 | −3146 | 3121 | −2649 |
| Coeff 14 | 2222 | 41 | 2031 | 3046 | 2934 | 803 | 2344 | −2171 | 2452 |
| Coeff 15 | −1608 | 609 | −1485 | 13176 | −2205 | −196 | −1769 | 1748 | −1755 |
| Coeff 16 | 1132 | 1666 | 1051 | 2429 | 1465 | 149 | 1252 | −1426 | 1230 |
| Coeff 17 | −751 | 934 | −694 | −1130 | −975 | 12 | −829 | 1161 | −813 |

-continued

| | | | | | | | | | |
|---|---|---|---|---|---|---|---|---|---|
| Coeff 18 | 440 | 76 | 371 | 486 | 572 | −125 | 482 | −933 | 475 |
| Coeff 19 | −179 | 28 | −227 | −417 | −240 | 204 | −196 | 731 | −198 |
| Coeff 20 | 4 | −25 | 12 | 353 | −30 | −253 | −35 | −540 | −26 |
| Coeff 21 | 144 | 19 | 123 | −266 | 204 | 242 | 183 | 323 | 170 |
| Coeff 22 | −174 | −11 | −155 | 164 | −236 | −177 | −209 | −141 | −197 |
| Coeff 23 | 117 | 5 | 106 | −74 | 157 | 92 | 138 | 36 | 131 |
| Coeff 24 | −37 | −1 | −34 | 18 | −49 | −24 | −43 | −1 | −41 |

| | $H_R$ (0, 100) | $H_L$ (−10, 12) | $H_R$ (−10, 12) | $H_L$ (−30, 100) | $H_R$ (−30, 100) | $H_L$ (−90, 100) | $H_R$ (−90, 100) | $H_L$ (−90, 12) | $H_R$ (−90, 12) |
|---|---|---|---|---|---|---|---|---|---|
| Coeff 1 | −30 | 74 | −35 | 8 | −38 | −4 | −28 | 0 | −29 |
| Coeff 2 | 52 | −282 | 65 | −61 | 63 | 28 | 50 | −2 | 45 |
| Coeff 3 | 56 | 550 | 42 | 188 | 84 | −80 | 45 | 4 | 77 |
| Coeff 4 | −394 | −763 | −394 | −390 | −531 | 156 | −351 | −7 | −443 |
| Coeff 5 | 981 | 816 | 1019 | 630 | 1316 | −237 | 913 | 10 | 1092 |
| Coeff 6 | −1832 | −805 | −1939 | −912 | −2526 | 291 | −2423 | −11 | −2328 |
| Coeff 7 | 2981 | 202 | 2984 | 1127 | 3653 | −361 | 1917 | 13 | 3060 |
| Coeff 8 | −10653 | −18 | −11708 | −1545 | −13068 | 428 | −7062 | −15 | −7850 |
| Coeff 9 | 26594 | −4478 | 28461 | 2061 | 29264 | −502 | 25249 | 16 | 25530 |
| Coeff 10 | 18525 | 27537 | 19072 | −3696 | 19203 | 591 | 18023 | −17 | 17759 |
| Coeff 11 | −10840 | 5974 | −11909 | 7549 | −12950 | −712 | −7876 | 18 | −8143 |
| Coeff 12 | 4475 | −5400 | 4800 | 15873 | 5469 | 799 | 3330 | −19 | 4201 |
| Coeff 13 | −2489 | 3261 | −2820 | −3179 | −3282 | −1692 | −1797 | 12 | −2636 |
| Coeff 14 | 2045 | −2511 | 2152 | 960 | 2645 | 4323 | 1804 | 10 | 2112 |
| Coeff 15 | −1454 | 2024 | −1577 | −264 | −1951 | 15544 | −1332 | 488 | −1528 |
| Coeff 16 | 1001 | −1667 | 1102 | 112 | 1325 | 1615 | 948 | 1422 | 1074 |
| Coeff 17 | −641 | 1373 | −717 | 81 | −872 | −901 | −631 | 672 | −711 |
| Coeff 18 | 348 | −1116 | 403 | −210 | 501 | 443 | 346 | 11 | 413 |
| Coeff 19 | −111 | 887 | −146 | 297 | −196 | −415 | −201 | 34 | −165 |
| Coeff 20 | −80 | −667 | −62 | −347 | −51 | 396 | 11 | −24 | −8 |
| Coeff 21 | 193 | 410 | 190 | 320 | 207 | −321 | 110 | 19 | 146 |
| Coeff 22 | −199 | −188 | −204 | −228 | −230 | 210 | −139 | −11 | −171 |
| Coeff 23 | 126 | 53 | 132 | 116 | 150 | −100 | 96 | 5 | 114 |
| Coeff 24 | −39 | −4 | −41 | −30 | −47 | 25 | −30 | −1 | −36 |

Figures 4A, 4B, 4C:
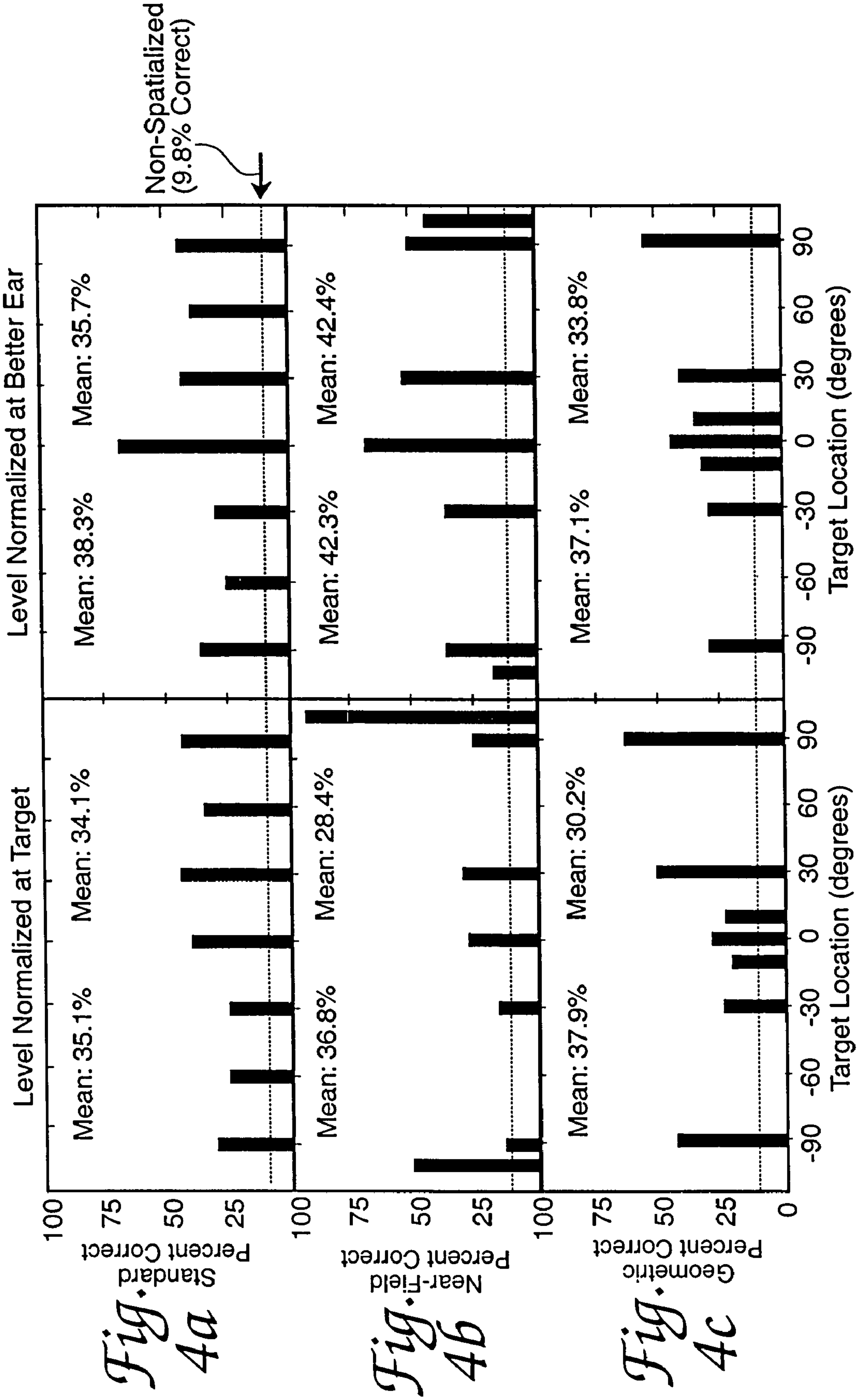
FIG. 4*a* shows a comparison of performance in a traditional multi-talker standard configuration to performance in the proposed configurations of the invention.
FIG. 4*b* shows a comparison of performance in a traditional multi-talker standard configuration to performance in the proposed configurations of the invention.
FIG. 4*c* shows a comparison of performance in a traditional multi-talker standard configuration to performance in the proposed configurations of the invention.

FIGS. 4*a*-4*c* show a comparison of performance in a traditional multi-talker display configuration (upper left panel) to performance in the proposed configurations used in this experiment in a seven-talker call-sign, color and number identification task. Each bar represents mean performance at a particular location in azimuth. The horizontal dotted lines represent performance in the non-spatialized condition where the talkers were all electronically mixed into one audio signal that was presented diotically (i.e., the same signal to both ears). These data represent a total of 27,800 trials so differences larger than approximately 1.1% across the mean percent correct values in the different conditions are statistically significant at the $p<0.05$ level.

The right column of FIG. 4 shows the effect that better-ear normalization had on performance in each of the spatial configurations. In the standard baseline condition, the right column of FIG. 4*a*, this normalization improved performance by more than 9%, simply by rescaling the relative levels of the different HRTFs. Most of this improvement came from a large increase in performance for the talker at 0 degrees azimuth. This increase was not, however, offset by any substantial decreases in performance at other locations, and the median percent correct increased from 34.1% to 35.7%.

In the geometric configuration, the right column of FIG. 4*c*, the better-ear normalization did not significantly improve overall performance, but it did result in a more even spread of performance across the seven talker locations (median performance increased approximately 12%, from 30.2% to 33.8%).

Better-ear normalization had the greatest effect in the “near-field” configuration, shown in the right column of FIG. 4*b*, where it boosted overall performance by nearly 15% (36.8% to 42.3%) and boosted median performance by nearly 50% (28.4% to 42.4%). In comparison to the standard baseline condition that is the current state of the art in multi-talker display systems, left column of FIG. 4*a*, this better-ear normalized near-field listening condition produces more than 20% better performance overall (a difference of more than 6 standard deviations of the means) and 24% better median performance. Furthermore, it should be noted that this performance improvement was obtained simply by changing the locations and scaling factors of the HRTF filters used in the spatialization system. No additional hardware or software was required to obtain these performance benefits. Thus, the proposed invention is capable of producing a substantial and significant improvement in the performance of multi-talker speech display systems for little or no increase in production cost.

In summary, significant aspects of the invention are a system that spatially separates more than 5 possible speech channels with HRTFs measured with relatively distant sources (>0.5 m) at points in the left-right dimension that are not equally spaced, but rather are spaced close together (<30 degrees) at points near 0 degrees azimuth and spaced wide apart (≧45 degrees) at more lateral locations. Additionally, a system of the invention may combine these unevenly-spaced far-field HRTF locations with two additional locations measured at ±90 degrees in azimuth and at locations near the listener’s head (25 cm or less from the center of the head). Finally, the system of the invention sets the relative levels of the talkers in each location such that each talker will produce roughly the same overall level at earphone where the signal generated by that talker is most intense.

While the apparatus and method herein described constitute a preferred embodiment of the invention, it is to be understood that the invention is not limited to this precise form of apparatus or method and that changes may be made therein without departing from the scope of the invention, which is defined in the appended claims.

I claim:

1. An interference-minimizing and speech-intelligibility-maximizing head related transfer function (HRTF) spatial configuration method comprising the steps of:

receiving a plurality of speech input signals from competing talkers located at different source locations;

filtering said speech input signals with head-related transfer functions;

normalizing levels of said head related transfer functions from each source location whereby a speech-shaped noise input will produce the same level in the ear where the output is most intense at all of the source locations;

combining the outputs of said head related transfer functions; and communicating outputs of said head related transfer functions to headphones of a system operator.

2. The interference-minimizing and speech-intelligibility-maximizing head related transfer function (HRTF) spatial configuration method of claim 1 further comprising the step of applying automatic gain control to each of said plurality of speech input signals.

3. The interference-minimizing and speech-intelligibility-maximizing head related transfer function (HRTF) spatial configuration method of claim 1 further comprising the step of system operator controlling relative levels of said competing talkers thereby providing the capability to amplify a single, important speech input signal.

4. An interference-minimizing and speech-intelligibility-maximizing head related transfer function spatial configuration method comprising the steps of:

receiving a plurality of speech input signals from competing talkers located at different source locations;

filtering said speech input signals with head-related transfer functions;

normalizing by taking the RMS of said head related transfer functions from each source location to set levels so a speech-shaped noise input will produce the same level of output at the ear where the output is most intense at all of the source locations with the highest RMS level at that location;

spatially configuring said head related transfer functions at azimuth angles of −90 degrees, −30 degrees, 0 degrees, 30 degrees and 90 degrees at a distance of 1 meter measured from center point of a head of each of said competing talkers;

locating additional head related transfer functions of said speech input signals at −90 degrees and 90 degrees in azimuth at a distance of 12 cm from the center of the head;

means for digitally summing left head related transfer functions;

means for digitally summing right head related transfer function channels;

communicating outputs of said head related transfer functions to headphones of a system operator.

5. The interference-minimizing and speech-intelligibility-maximizing head related transfer function (HRTF) spatial configuration device of claim 4 further comprising a plurality of automatic gain control means for equalizing the levels of said speech input signals.

6. The interference-minimizing and speech-intelligibility-maximizing head related transfer function (HRTF) spatial configuration device of claim 4 further comprising means for operator selection for sending a speech input signal to a specific channel.

7. An interference-minimizing and speech-intelligibility-maximizing head related transfer function (HRTF) spatial configuration device comprising:

a plurality of simultaneous speech channels for communicating analog speech input signals;

a plurality of analog-to-digital converters receiving and converting output from said simultaneous speech channels;

two finite impulse response filters for normalizing output of said analog-to-digital converters by convolving each output from said analog-to-digital converters, said first finite impulse response filter coefficients representing left ear head related transfer functions from preselected talker locations and said second finite impulse response filter coefficients representing right ear head related transfer function from preselected talker locations whereby each talker will produce the same overall level in the selected ear where a continuous speech-shaped noise signal convolved with corresponding left and right ear head related transfer functions;

combining outputs of said left ear head related transfer functions;

combining outputs of said right ear head related transfer functions; and communicating outputs of said left and right ear head related transfer functions to headphones of a system operator.

8. The interference-minimizing and speech-intelligibility-maximizing head related transfer function (HRTF) spatial configuration device of claim 7 further comprising an automatic gain control algorithm for equalizing speech input signals from said simultaneous speech channels.

* * * * *